US010330762B2

(12) United States Patent
Qin

(10) Patent No.: US 10,330,762 B2
(45) Date of Patent: Jun. 25, 2019

(54) MEASUREMENT OF BLOOD VOLUME USING VELOCITY-SELECTIVE PULSE TRAINS ON MRI

(71) Applicant: THE JOHNS HOPKINS UNIVERSITY, Baltimore, MD (US)

(72) Inventor: Qin Qin, Ellicott City, MD (US)

(73) Assignee: The Johns Hopkins University, Baltimore, MD (US)

( * ) Notice: Subject to any disclaimer, the term of this patent is extended or adjusted under 35 U.S.C. 154(b) by 255 days.

(21) Appl. No.: 15/485,412

(22) Filed: Apr. 12, 2017

(65) Prior Publication Data
US 2017/0293008 A1 Oct. 12, 2017

Related U.S. Application Data

(60) Provisional application No. 62/321,429, filed on Apr. 12, 2016.

(51) Int. Cl.
*G01V 3/00* (2006.01)
*G01R 33/50* (2006.01)
*G01R 33/56* (2006.01)
*G01R 33/563* (2006.01)

(52) U.S. Cl.
CPC ......... *G01R 33/50* (2013.01); *G01R 33/5601* (2013.01); *G01R 33/5607* (2013.01); *G01R 33/56366* (2013.01)

(58) Field of Classification Search
CPC .................................................. G01R 33/50
USPC ........................................ 324/309, 307, 306
See application file for complete search history.

(56) References Cited

U.S. PATENT DOCUMENTS

| 8,958,866 | B2* | 2/2015 | Bolar | A61B 5/055 324/309 |
| 8,965,480 | B2* | 2/2015 | Jung | A61B 5/0263 600/419 |
| 2011/0245656 | A1* | 10/2011 | Bammer | G01R 33/56366 600/411 |
| 2011/0304333 | A1 | 12/2011 | Rapoport | |
| 2012/0283547 | A1 | 11/2012 | Wong et al. | |
| 2015/0305645 | A1* | 10/2015 | Ouyang | A61B 5/055 600/419 |

OTHER PUBLICATIONS

Wong, E., et al., "A method for dynamic imaging of blood volume" Proc. 5th ISMRM, p. 372, 1997.

(Continued)

*Primary Examiner* — Louis M Arana
(74) *Attorney, Agent, or Firm* — Johns Hopkins Technology Ventures

(57) ABSTRACT

The present invention is directed to a system and method for measuring blood volume using non-contrast-enhanced magnetic resonance imaging. The method of the present invention includes a subtraction-based method using a pair of acquisitions immediately following velocity-sensitized pulse trains for the label module and its corresponding control module, respectively. The signal of static tissue is canceled out and the difference signal comes from the flowing blood compartment above a cutoff velocity. After normalizing to a proton density-weighted image acquired separately and scaled with the blood T1 and T2 relaxation factors, quantitative measurement of blood volume is then obtained.

20 Claims, 7 Drawing Sheets

(56) References Cited

OTHER PUBLICATIONS

Alsop, D., et al., "Gradient sensitization for the selective imaging of blood volume and quantification of oxygen extraction" Proc. 7th ISMRM, p. 1761, 1999.

* cited by examiner

MEASUREMENT OF BLOOD VOLUME USING VELOCITY-SELECTIVE PULSE TRAINS ON MRI

CROSS REFERENCE TO RELATED APPLICATION

This application claims the benefit of U.S. Provisional Patent Application No. 62/321,429 filed on Apr. 12, 2016, which is incorporated by reference, herein, in its entirety.

GOVERNMENT SUPPORT

This invention was made with government support under grant number NIH K25 HL121192 and P41 EB015909 awarded by the National Institutes of Health. The government has certain rights in the invention.

FIELD OF THE INVENTION

The present invention relates generally to medical imaging. More particularly, the present invention relates to a system and method for measurement of blood volume using MRI.

BACKGROUND OF THE INVENTION

Velocity-selective (VS) pulse trains can provide unique functionalities when designing pulse sequences for various Magnetic Resonance Imaging (MRI) based hemodynamic evaluation: MR angiography (MRA); blood flow (perfusion), blood volume, or transit time; oxygen extraction fraction; metabolic rate of oxygen.

Quantitative measurement of cerebral blood volume (CBV), in addition to cerebral blood flow (CBF), provides more thorough examination of cerebral circulation for both neurophysiology and brain disorders. Baseline CBV is indispensable for understanding BOLD signal mechanism with various biophysical models and CBV change during activation also provides important fMRI contrast. The ratio of CBV to CBF, called mean transit time (MTT), is another important hemodynamic parameter which reflects the local cerebral perfusion pressure in ischemic episodes. For patients with occluded carotid arteries, increased oxygenation extraction fraction (OEF) and CBV yet at normal CBF (autoregulatory vasodilation) were associated with higher risk of stroke. For patients with cerebral gliomas, new blood vessel formation (angiogenesis) and thus elevated CBV indicated higher tumor grading with poor prognosis.

Regional CBV values have been imaged in the clinic on different modalities: positron emission tomography (PET) with inhaled C15O, single photon emission computed tomography (SPECT) using radioisotopes such as 99mTc, dynamic perfusion computer tomography (PCT) using iodinated tracers, and dynamic susceptibility contrast (DSC)-MRI with injected Gadolinium (Gd)-based contrast agents. Being free of ionizing radiation, DSC-MRI obtains perfusion-weighted signal during the first pass of the contrast bolus through the vasculature. In the clinical applications, DSC-MRI often reports qualitative perfusion measures, such as relative CBV compared to a normal white mater area. For absolute quantification of CBV, this technique faces several challenges, e.g., identification of global arterial input function (AIF) from a pure blood voxel, consideration of the delay and dispersion of the local AIF, and non-linear response of intravascular Gd concentration. A newer Gd-based approach applies an inversion recover pulse sequence with the blood signal nulled before the bolus administration and fully recovered after the contrast passage due to the shortening of blood T1, hence generating the normalized pre/postcontrast difference images as absolute CBV maps. However, the risks of developing nephrogenic systemic fibrosis (NSF) limit Gd-enhanced MRI techniques on patient population with impaired renal function and the finding of gadolinium deposition in neuro tissues even for people without kidney diseases warrant caution of repeat use of certain Gd-based contrast agents. Iron oxide nanoparticle was used instead in another steady-state study which calculated relative CBV maps through subtraction of pre/post contrast.

To lower safety risks and cost, it is long desired to have noninvasive MRI methods for perfusion measurement without requiring any exogenous contrast agent. Arterial spin labeling (ASL) methods acquire perfusion-weighted signal by subtracting the supplying arterial blood-labeled images from the controlled pairs. Although becoming more standardized for clinical applications, ASL mainly provides CBF measurement. Spatially-selective ASL techniques were developed to estimate the volume of the arterial blood compartment, CBVa.

Intravoxel incoherent motion (IVIM) technique applies motion-sensitized gradients with multiple b values and extracts information of both the fraction of blood compartment and diffusion constants of tissue and microvasculature by fitting a bi-exponential model. IVIM assumes that water spins flowing in the capillaries change velocity and direction several times during the applied gradient waveforms, much like a random walk of spins in the diffusion process, except about 10 times faster. Despite gaining popularity in clinical studies for different organs, the quantification precision and accuracy of this fitting-based method still suffers methodological issues such as requirement of high signal-to-noise ratio (SNR) and the validity of the bi-exponential model, especially in the brain where CBV is smaller than 5% and pulsatile flow of cerebrospinal fluid (CSF) is present. A further overlooked drawback of the IVIM signal model is its neglecting of the T1 and T2 relaxation factors in each compartment, thus the results are dependent on the employed repetition time (TR) and echo time (TE) respectively.

It would therefore be advantageous to provide a reliable method for measurement of blood volume without having to inject exogenous contrast.

SUMMARY OF THE INVENTION

The foregoing needs are met by the present invention which provides a method for determining blood volume for a subject including performing velocity-selective labeling/control modules with a magnetic resonance imaging scanner. The method includes using a velocity-sensitized labeling module comprising ±90° hard pulses. The method includes embedding refocusing pulses between velocity-sensitive labeling/control modules. The method also includes performing alternating velocity-encoding gradients, wherein the alternating velocity-encoding gradients are configured to suppress the signal of blood flowing above a cutoff velocity. Further, the method includes leaving a gap between each gradient and RF pulse to minimize the effect of gradient imperfections, such as eddy currents. Additionally, the method includes performing a pair of acquisitions with the magnetic resonance imaging scanner and determining blood volume from the pair of acquisitions. The method includes generating a non-contrast-enhanced MRI map of blood volume. The method includes using velocity-selective (VS) pulse trains in paired control and label modules for separating vascular signal by subtraction. The method includes leveraging a subtraction-based method using a pair of acquisitions immediately following velocity-sensitized pulse trains for a label module and its corresponding control module, respectively. The method includes cancelling out a signal of static tissue and a resulting difference signal comes from the flowing blood compartment above a cutoff velocity. The method includes normalizing to a proton density-weighted image acquired separately and scaled with the blood T1 and T2 relaxation factors and obtaining a quantitative measurement of blood volume.

In accordance with an aspect of the present invention, a system for determining blood volume for a subject includes a magnetic resonance imager. The system also includes a non-transitory computer readable medium programmed for performing velocity-sensitized labeling modules with a magnetic resonance imaging scanner. The method includes embedding refocusing pulses between velocity-sensitive labeling modules. The method includes performing alternating velocity-encoding gradients, wherein the alternating velocity-encoding gradients are configured to suppress the signal of blood flowing above a cutoff velocity and performing a pair of acquisitions with the magnetic resonance imaging scanner. The method also includes determining blood volume from the subtraction of the pair of acquisitions, then scaled with the relaxation factors of blood T1 and T2.

In accordance with another aspect of the present invention, the method includes refocusing pulses comprising adiabatic pulses or composite pulses. The method includes using a velocity-sensitized labeling module comprising ±90° pulses. The method includes using velocity-encoding gradients. Additionally, the method includes leaving a gap between each gradient and RF pulse to minimize the effect of eddy currents. The method includes generating a non-contrast-enhanced MRI map of blood volume. Additionally, the method includes leveraging a subtraction-based method using a pair of acquisitions immediately following velocity-sensitized pulse trains for a label module and its corresponding control module, respectively. The method includes cancelling out a signal of static tissue and a resulting difference signal comes from the flowing blood compartment above a cutoff velocity. Further, the method includes normalizing to a proton density-weighted image acquired separately and scaled with the blood T1 and T2 relaxation factors and obtaining a quantitative measurement of blood volume.

DETAILED DESCRIPTION

The presently disclosed subject matter now will be described more fully hereinafter with reference to the accompanying Drawings, in which some, but not all embodiments of the inventions are shown. Like numbers refer to like elements throughout. The presently disclosed subject matter may be embodied in many different forms and should not be construed as limited to the embodiments set forth herein; rather, these embodiments are provided so that this disclosure will satisfy applicable legal requirements. Indeed, many modifications and other embodiments of the presently disclosed subject matter set forth herein will come to mind to one skilled in the art to which the presently disclosed subject matter pertains, having the benefit of the teachings presented in the foregoing descriptions and the associated Drawings. Therefore, it is to be understood that the presently disclosed subject matter is not to be limited to the specific embodiments disclosed and that modifications and other embodiments are intended to be included within the scope of the appended claims.

The present invention is directed to a system and method for determining blood volume in a subject. Blood volume is an important hemodynamic parameter for monitoring many disorders, such as stoke and cancer. Current MRI techniques for quantification of absolute blood volume for such clinical applications all require injecting exogenous contrast agents. To reduce associated safety risks and cost, the present invention is directed to a non-contrast-enhanced MRI method for blood volume mapping on MRI.

The present invention leverages a subtraction-based method using a pair of acquisitions immediately following velocity-sensitized pulse trains for the label module and its corresponding control module, respectively. The signal of static tissue is canceled out and the difference signal come from the flowing blood compartment above a cutoff velocity. After normalizing to a proton density-weighted image acquired separately and scaled with the blood T1 and T2 relaxation factors, quantitative measurement of blood volume is then obtained.

A basic velocity-sensitized labeling module includes ±90° pulses enclosing refocusing pulses surrounded by alternating velocity-encoding gradients which suppresses the signal of blood flowing above a cutoff velocity (Vc). In contrast, spins moving below the Vc, mainly the static ones, only experience the T2 weighting. A gap between each gradient and RF pulse is kept to minimize the effect of eddy currents. The corresponding control module can either keep the all the gradients but maintain velocity-compensated waveform and balanced diffusion weighting, or have gradients turned off for a velocity-insensitive waveform. The labeling/control modules are immediately followed by acquisitions.

Figure 1A:
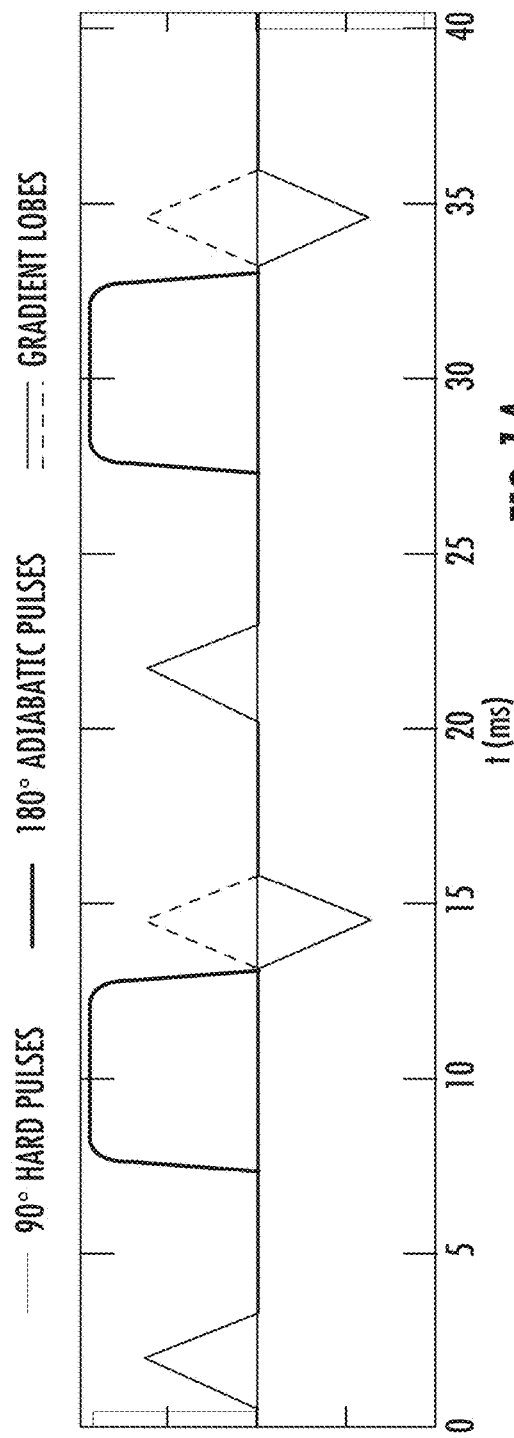
FIGS. 1A and 1B illustrate schematic diagrams of pulse sequences, according to an embodiment of the present invention.
Figure 1B:
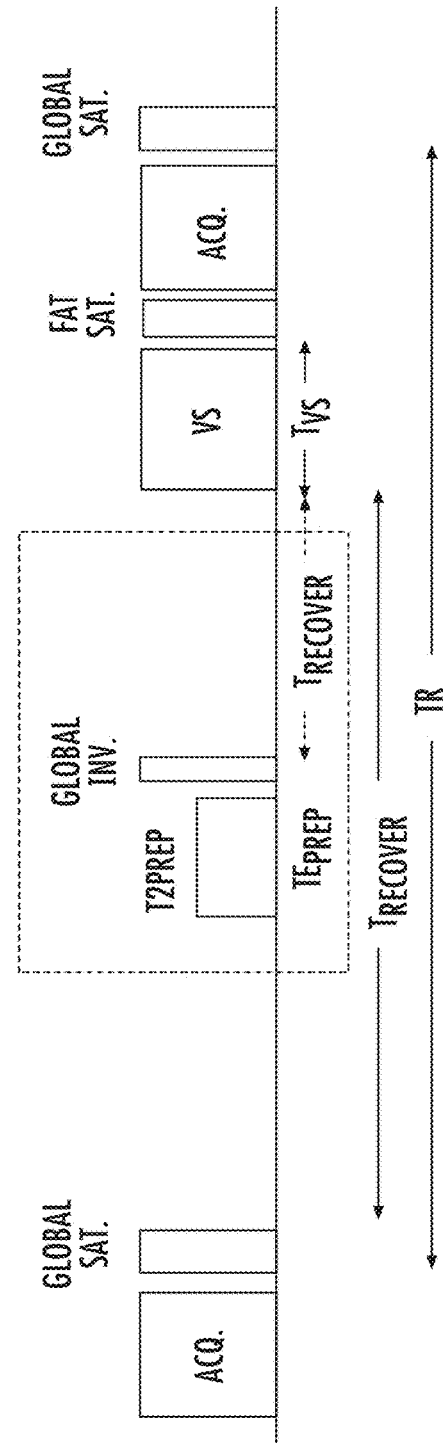

In an exemplary implementation of the present method that is not meant to be considered limiting and is included simply as an illustration of the invention, a basic VS labeling module includes ±90° hard pulses enclosing a pair of refocusing pulses with surrounding velocity-encoding gradients, as illustrated in FIG. 1A. FIGS. 1A and 1B illustrate schematic diagrams of pulse sequences, according to an embodiment of the present invention. FIGS. 1A and 1B show the pulse sequence diagram of an embodiment of the present invention for absolute CBV measurement using velocity-selective (VS) pulse trains for control and labeling. More particularly, FIG. 1A illustrates a diagram of a VS pulse train with gradients of alternating polarities surrounding refocusing pulses for velocity-sensitized waveform (solid lines) and uni-polar gradients for velocity-compensated waveform (dashed lines for the polarity-switched gradient lobes). FIG. 1B illustrates a pulse sequence consists of a global saturation pulse train, an optional T2prep prepared inversion for CSF suppression, and the VS control/label module followed by acquisition.

When assuming laminar flow, the VS module saturates the signal of blood flowing above the cutoff velocity (Vc). In contrast, spins moving below the Vc, including the static tissue, only experience the T2 weighting during the TVS and diffusion weighting by the motion-sensitized gradients. The use of refocusing pulses with interleaved gradients in diffusion MRI reduces eddy currents. For the present invention, double refocused hyperbolic tangent (DRHT) pulses (5.0 ms, tan h/tan, maximum amplitude of 575 Hz and a frequency sweep of 8 kHz) were employed and compared with double refocused composite (DRCP) pulses ($90°_x180°_y90°_x$, 1.7 ms); four alternating triangle gradient lobes with a ramp time of 1.6 ms and maximum amplitude of $G_{VS}$=26 mT/m yield the Vc=3.5 mm/s, which is within the range of the velocities of capillary blood (1~9 mm/s). At least a 4.0 ms gap between each gradient and following RF pulse is maintained to minimize the effect of eddy currents. For this VS module, $T_{VS}$=40 ms, $b_{VS}$=4.8 s/mm$^2$.

For the corresponding control module, two negative gradient lobes were replaced with positive ones (dashed lines in FIG. 1A) for velocity-compensated gradient waveform. Alternatively, conventional velocity-insensitive control module with gradient lobes turned off (black lines in FIG. 1A) was compared.

The pulse sequence diagram for measuring baseline CBV is shown in FIG. 1B. A tailored hard-pulse train (65°, 83°, 143°, 162°) was applied post-acquisition for global saturation. When CSF suppression is desired, an SNR-improved inversion recovery method was implemented, which utilized a T2prep module (DRHT, TEprep=300 ms) right before the inversion pulse (hyperbolic secant, 10 ms) to saturate tissues with relatively short T2 values and thus rendering higher longitudinal magnetizations (Mz) during recovery. The T2prep module was applied 4.90 s after the global saturation and the recovery delay before the label/control modules was set to be $T_{recover}$=2.0 s for this modified CSF-nulling sequence. In contrast, a sequence without CSF nulling modules (the dashed box in FIG. 1B) had a recovery delay $T_{recover}$=3.6 s after the global saturation. Immediately following the VS pulse trains, a fat-suppression module (spectral presaturation with inversion recovery, SPIR) was inserted before data acquisition.

Experiments were conducted on a 3T Philips Achieva scanner (Philips Medical Systems, Best, The Netherlands) using the body coil for RF transmission (maximum amplitude 13.5 µT) and a 32-channel head-only coil for signal reception. The combined maximum strength and slew rate of the standard gradient coil are 40 mT/m and 200 mT/m/ms, respectively.

Similar to previous VS-ASL studies, a spherical silicone oil phantom (T1/T2=1111/227 ms) was scanned to evaluate the effects of eddy currents and other gradient imperfections. The sequence without CSF nulling modules was applied with 2D acquisition for 10 slices and the parameters were identical with the human studies detailed below. The gradients of the VS pulse trains were applied along the left-right (L-R), anterior-posterior (A-P), or superior-inferior (S-I) direction. VS pulse trains using either DRHT or DRCP were examined, at both Vc=3.5 mm/s (described above) and 2.0 mm/s (3.2 ms duration of each trapezoidal gradient lobe, 0.7 ms ramp time and maximum amplitude of $G_{VS}$=30 mT/m). Using a TR=4.0 s, the total measurement time after 24 repetitions was about 3.4 min for each pulse train configuration. Proton density-weighted image of signal intensity ($SI_{PD}$) was also acquired with TR=10 s. The averaged signal difference for the label/control pairs across repetitions were normalized to the $SI_{PD}$ image. For each pulse train configuration, the mean and standard deviation (SD) of the normalized differences from all the pixels within the phantom were calculated.

Six healthy volunteers (30-41 yrs old, three males and three females) were enrolled after providing informed consent in accordance with the Institutional Review Board guidelines. In this study, 2D multi-slice single-shot echo-planar imaging (EPI) was performed in axial planes. Acquisition parameters: the transverse field of view (FOV) was 186×213 mm$^2$ with 10 slices acquired at a slice thickness of 4.4 mm without gaps; the acquisition resolution was 3.3×3.5 mm$^2$ and the reconstructed voxel size was 1.9×1.9 mm$^2$; phase encoding was along the A-P direction with the EPI factor (the number of k-space lines collected per echo train) of 25 and sensitivity encoding (SENSE) factor of 2.5; the echo train duration per slice was 14.0 ms and the effective echo time (TE) was 8.7 ms. For sequences with the CSF-nulling modules, the repetition time (TR) was 7.7 s, and the total measurement time after 24 averages of interleaved label and control was about 6.4 min.

On each volunteer, four scans with Vc=3.5 mm/s were included: Exp. (1), velocity-compensated control with CSF-nulling; Exp. (2), velocity-insensitive control with CSF-nulling; Exp. (3), velocity-compensated control without CSF-nulling; Exp. (4), repeat Exp. (3) with an extra T2prep module (DRHT, TEprep=300 ms) before VS pulse train to suppress blood signal and visualize signal from CSF. On a subset of five subjects, Exp. (1) was repeated with Vc=30.0 mm/s ($G_{VS}$=3 mT/m), 5.0 mm/s ($G_{VS}$=18 mT/m) and 2.0 mm/s (described in the phantom experiments) as Exp. (5)-(7), respectively. These different scans were randomly ordered and all participants were instructed to keep still with their head stabilized with foam pads.

In addition, a proton density-weighted image ($SI_{PD}$) (TR=10 s) was acquired for CBV quantification purposes (0.3 min); a double inversion recovery (DIR) image was obtained to visualize gray matter only (TR=10 s; TI_1=3.58 s; TI_2=0.48 s; 0.3 min); a scan with an extra T2prep module (DRHT, TEprep=300 ms) before acquisition was carried to suppress tissue signal and visualize signal from CSF (TR=5.5 s, 0.2 min). All of these images were collected with the same resolution and acquisition scheme.

Experimental data were processed using Matlab (MathWorks, Inc., Natick, Mass., USA). For tissue or blood, the contrast weightings by $T_1$, $T_2$ and ADC are given by:

$$M(T_1)=1-\exp(-T_{recover}/T_1) \quad [1]$$

$$M(T_2)=\exp(-T_{VS}/T_2) \quad [2]$$

$$M(ADC)=\exp(-b \cdot ADC) \quad [3]$$

For the control sequence where both the tissue (t) and blood (b) signal are preserved, the signal intensity of a voxel can be described as the sum of multiple compartments with weightings of their particular $T_1/T_2$ and apparent diffusion constants (ADC):

$$SI_{control} = SI_{PD} \cdot (1-x_b) \cdot M(T_{1,t}) \cdot M(T_{2,t}) \cdot M(ADC_t) + SI_{PD} \cdot x_b \cdot \Sigma(x_i \cdot M(T_{1,i}) \cdot M(T_{2,i}) \cdot M(ADC_i)) \quad [4]$$

in which $x_b$ is the water fraction of the blood in the voxel and $CBV = 100 \cdot \lambda \cdot x_b$. The CBV unit is mL blood/100 g tissue and $\lambda$ is the brain-blood partition coefficient, 0.9 mL blood/g tissue. $x_i$ is the fraction of CBV in each microvessel compartment: arteriolar (a), capillary (cp) and venular (v).

Figure 2A:
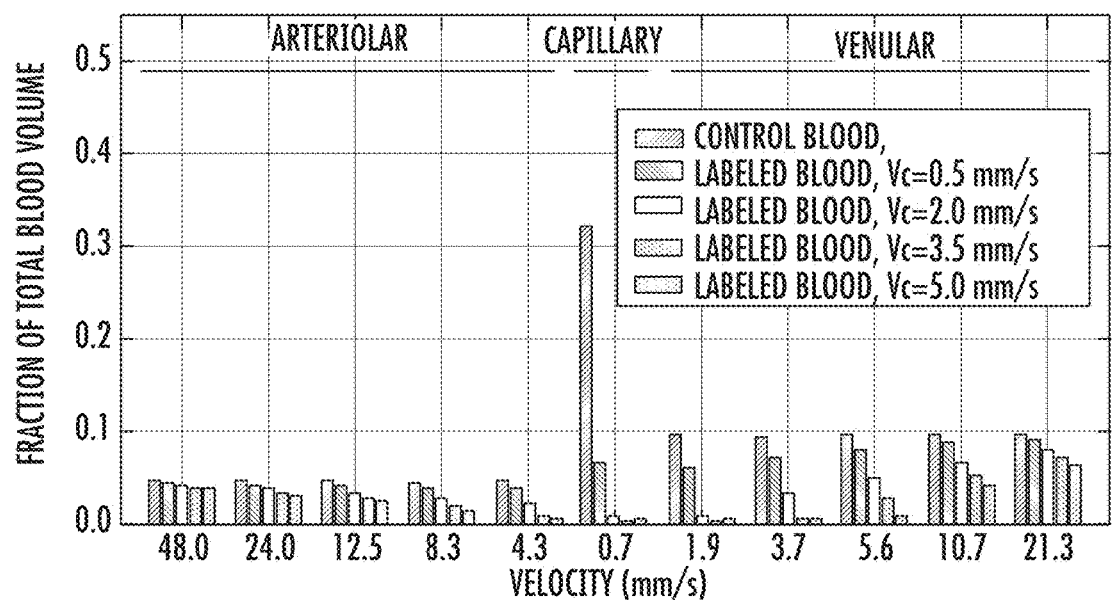
FIGS. 2A and 2B illustrate graphical views of a fraction of blood signal (with respect to the total blood volume) for control and each label condition (Vc=[0.5, 2.0, 3.5, 5.0] mm/s, respectively) for both the 11-compartment model in FIG. 2A and the three-compartment model (a, cp, v) in FIG. 2B.
Figure 2B:
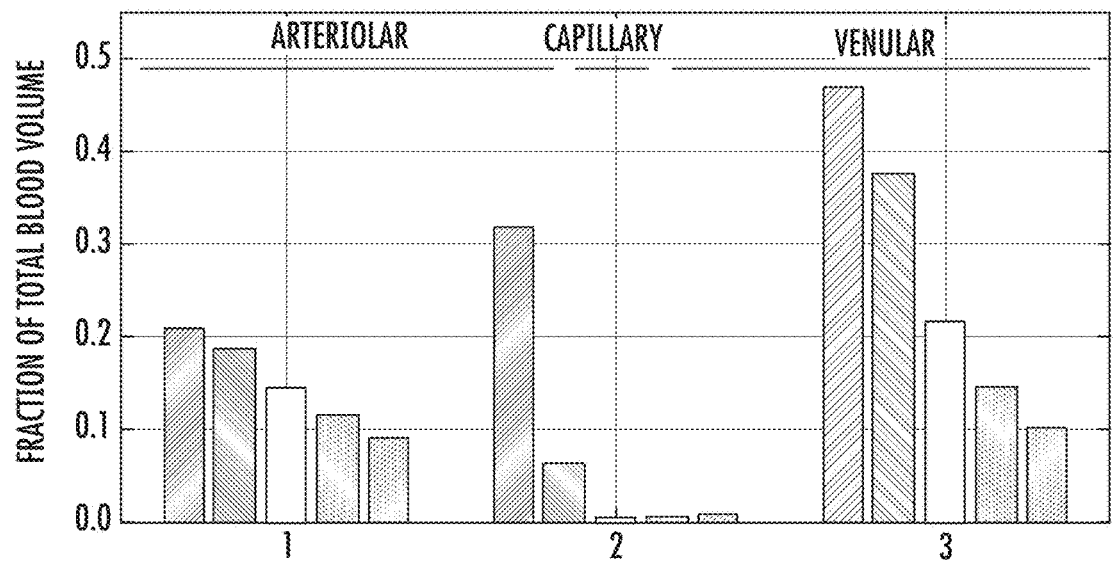

Ideally, VS pulse trains in the labeling module suppress all the blood signal and only tissue signal is retained. However, with different flowing velocities in individual segments of the microvasculature and also limited gradient performance on the clinical scanners, the percentage of blood being suppressed in each microvascular compartment, or the labeling efficiency $a_i$, varies with the VS pulse trains applying at different Vc. So for each labeled counterpart, realistically, the signal intensity still has contributions from unsuppressed blood:

$$SI_{label} = SI_{PD} \cdot (1-x_b) \cdot M(T_{1,t}) \cdot M(T_{2,t}) \cdot M(ADC_t) + SI_{PD} \cdot x_b \cdot \Sigma(x_i \cdot (1-a_i) \cdot M(T_{1,i}) \cdot M(T_{2,i}) \cdot M(ADC_i)) \quad [5]$$

derived using available morphological and physiological information, which consisted of 11 microvessel compartments with their respective volume fractions and velocities. For arteriolar, capillary and venular blood, $x_a = 0.21$, $x_{cp} = 0.33$, $x_v = 0.46$, as used before. Furthermore, the calculation of the Vc-specific labeling efficiency for each compartment was based on the projections of the 3-dimensional isotropic orientations of microvessels onto a single axis using a spherical coordinate. When the projected velocity was larger than Vc, it was considered being suppressed and the labeling efficiency a for the given velocity and Vc was computed as the ratio of the number of suppressed ones (label) to the total number of vessels (control). The compartmental volume fractions, velocities and labeling efficiencies for Vc=[0.5, 2.0, 3.5, 5.0] mm/s are listed in Table 1. The distributions of blood signal for the control and labeled conditions, out of the total blood volume, are illustrated in both the 11-compartment model (FIG. 2A) and 3-compartment (a, cp, v) model (FIG. 2B). Based on this simulation, Vc=3.5 mm/s did not label any capillary blood ($a_{cp}=0$) and partially labeled arterioles ($a_a=0.55$) and venules ($a_v=0.31$), respectively. FIGS. 2A and 2B illustrate graphical views of a fraction of blood signal (with respect to the total blood volume) for control and each label condition (Vc= [0.5, 2.0, 3.5, 5.0] mm/s, respectively) for both the 11-compartment model in FIG. 2A and the three-compartment model (a, cp, v) in FIG. 2B.

TABLE 1

Simulated Labeling Efficiencies of Velocity-Selective Pulse Trains with Different Cutoff Velocities (Vc) Along a Single Direction, for Individual Compartments with Various Flow Velocities Along Isotropic Orientations[a]

| | Arteriolar (a) | | | | | Capillary (cp) | Venular (v) | | | | |
|---|---|---|---|---|---|---|---|---|---|---|---|
| | a5 | a4 | a3 | a2 | a1 | cp | v1 | v2 | v3 | v4 | v5 |
| Fraction of CBV ($x_1$) | 0.04 | 0.04 | 0.04 0.21 | 0.04 | 0.05 | 0.33 0.33 | 0.10 | 0.09 | 0.09 0.46 | 0.09 | 0.09 |
| Velocity (mm/s) | 48.0 | 24.0 | 12.5 | 8.3 | 4.3 | 0.7 | 1.9 | 3.7 | 5.6 | 10.7 | 21.3 |
| Vc (mm/s) | | | | | Labeling efficiency in each microvessel compartment ($\alpha_1$) | | | | | | |
| 0.5 | 87% | 94% | 90% 89% | 87% | 78% | 20% 20% | 60% | 76% | 82% 80% | 89% | 94% |
| 2.0 | 90% | 83% | 72% 70% | 62% | 40% | 0% 0% | 0% | 33% | 50% 48% | 69% | 82% |
| 3.5 | 85% | 74% | 58% 55% | 44% | 13% | 0% 0% | 0% | 3% | 26% 31% | 53% | 72% |
| 5.0 | 80% | 66% | 46% 44% | 28% | 0% | 0% 0% | 0% | 0% | 7% 22% | 40% | 63% |

[a]These are calculated based on a morphological and physiological microcirculation model consisting of 11 microvessel compartments in arteriolar, capillary, and venular blood.

And the subtraction of the control and label signal intensities is:

$$SI_{control} - SI_{label} = SI_{PD} \cdot x_b \cdot \Sigma(x_i \cdot a_i \cdot M(T_{1,i}) \cdot M(T_{2,i}) \cdot M(ADC_i)) \quad [6]$$

Note that diffusion weighting by the motion-sensitized gradient can be omitted for the blood signal due to the rather small b-value used (<7 s/mm$^2$). Thus the CBV can be calculated as this difference normalized by the $SI_{PD}$ image and a scaling factor related only to $T_1$ and $T_2$ of each blood compartment:

$$CBV = \frac{100 \cdot \lambda \cdot (SI_{control} - SI_{label})}{SI_{PD} \cdot \Sigma(x_i \cdot \alpha_i \cdot M(T_{1,i}) \cdot M(T_{2,i}))} \quad [7]$$

In order to have a plausible account of $x_i$ and $a_i$ for each compartment, a previous microcirculation model was $T_{1,a}$ and $T_{1,v}$ at 3T were taken as 1.84 s and 1.70 s. Using the previously measured relationship between $T_2$, oxygenation fraction (Y) and hematocrit (Hct) in blood samples, $T_{2,a}$ and $T_{2,v}$ were set to be 138 ms and 53 ms for the employed inter-echo spacing of the VS pulse train ($\tau_{CPMG}$=20 ms) and $Y_a$=0.98, $Y_v$=0.6, Hct=0.42 were assumed for a typical healthy adult. Voxel-wise mean CBV maps from the CBV time courses measured repeatedly (24 times) and temporal SNR maps (ratio of the mean value to the SD of the CBV time courses) were produced for all the scans. For each subject, a binary gray matter mask (GM) was obtained from the DIR image using an empirical threshold and a ROI within the white matter (WM) was drawn manually using the $SI_{PD}$ image. In addition, voxels with large vessels were identified, through thresholding the CBV map (>12.5 mL/100 g, as used in as 2.5 times of the mean CBV) acquired in Exp. 2 with the velocity-insensitive control and CSF-nulling. These were excluded for the calculation of the averaged CBV within GM under different methods. Averaged CBV and SNR values from GM and WM ROIs were calculated for each experiment.

Figure 3A:
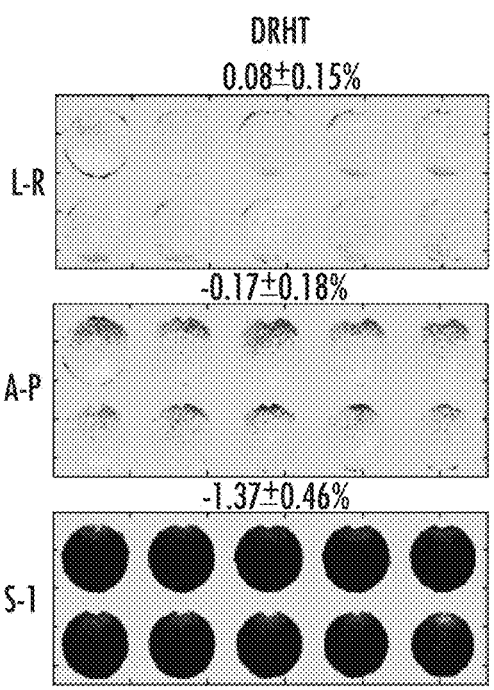
FIGS. 3A and 3B illustrate image views of signal difference errors on a phantom for the employed VS control/label modules caused by gradient imperfections (such as eddy currents) along different gradient orientations.
Figure 3B:
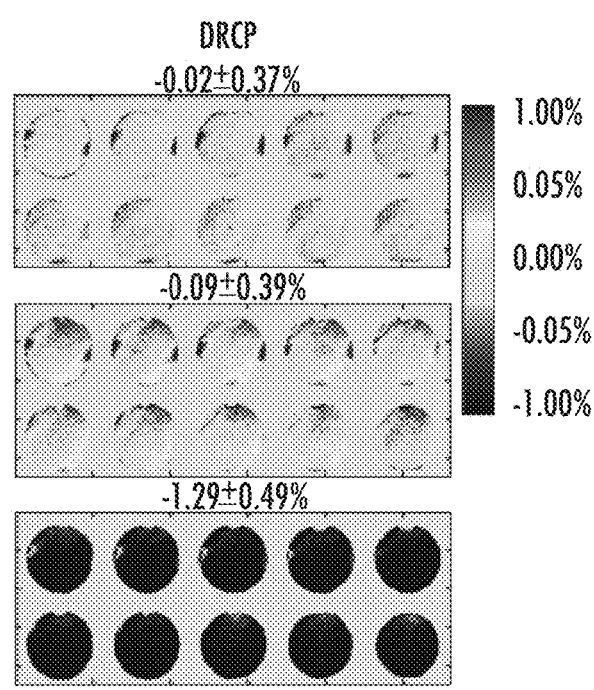

FIGS. 3A and 3B illustrate image views of signal difference errors on a phantom for the employed VS control/label modules caused by gradient imperfections (such as eddy currents) along different gradient orientations. Results of using DRHT pulses and DRCP pulses in the VS pulse trains with Vc=3.5 mm/s are shown in the left (FIG. 3A) and right (FIG. 3B) columns. Error maps are normalized to SIPD (percentage displayed). All acquired 10 slices are shown with the averaged error percentage (mean±SD) displayed at the top of each row. FIGS. 3A and 2B display the effects of gradient imperfections for three orthogonal directions at Vc=3.5 mm/s across 10 slices of the phantom. For the 40 ms VS pulse trains using DRHT (FIG. 3A), the normalized subtraction errors (mean±STD) for velocity-encoding along L-R, A-P, and S-I directions were 0.08±0.15%, −0.17±0.18%, and −1.37±0.46%, respectively, which showed lower sensitivity to eddy currents than the corresponding ones with DRCP (FIG. 3B), despite with shorter gaps between gradient lobes and refocusing pulses (4.0 vs. 5.7 ms). The VS pulse trains with Vc=2.0 mm/s also generated markedly higher gradient-related artifacts (data not shown) than the counterparts with Vc=3.5 mm/s. For the CBV measurements in vivo, the VS pulse trains with DRHT and gradients along the A-P direction was selected for its overall robustness to eddy currents and other gradient imperfections.

repeating Exp. (1) with Vc=30.0 mm/s, illustrated in FIG. 3G and Vc=5.0 mm/s, illustrated in FIG. 4H.

Figures 4A, 4B, 4C, 4D, 4E, 4F, 4G, 4H, 4I:
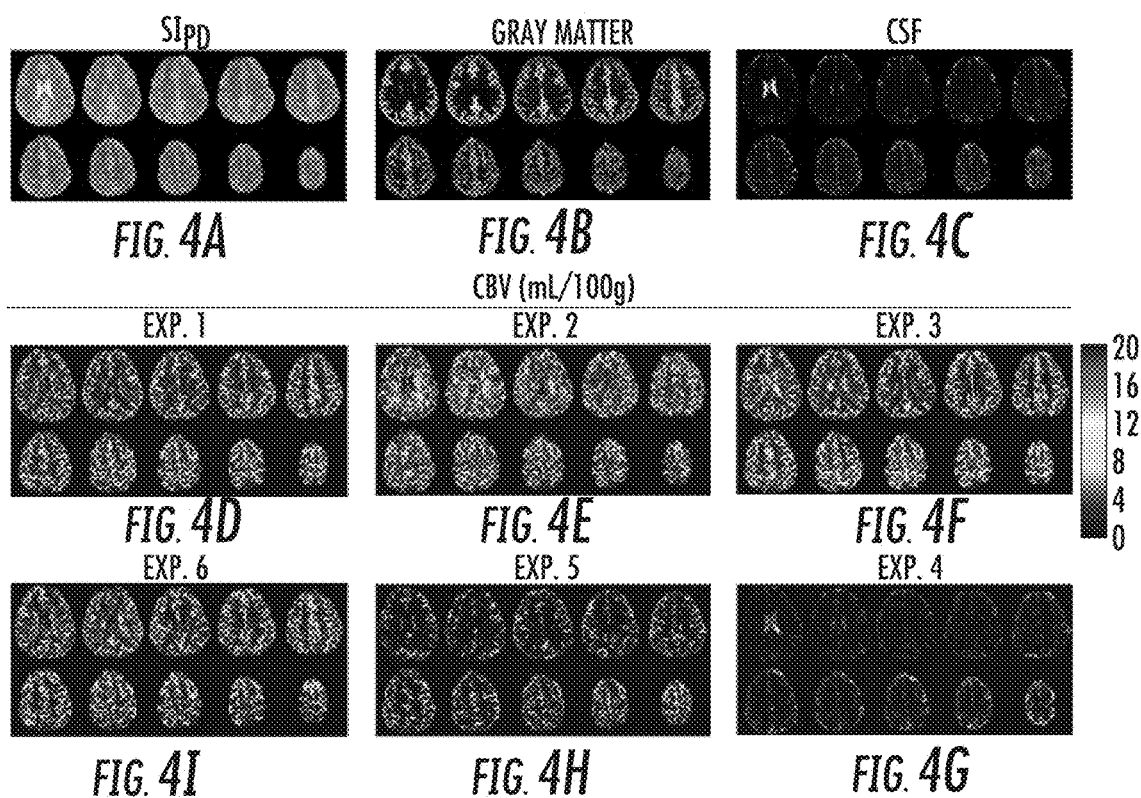
FIGS. 4A-4I illustrate image views of representative data of all 10 slices acquired from subject #2.
Figures 5A, 5B:
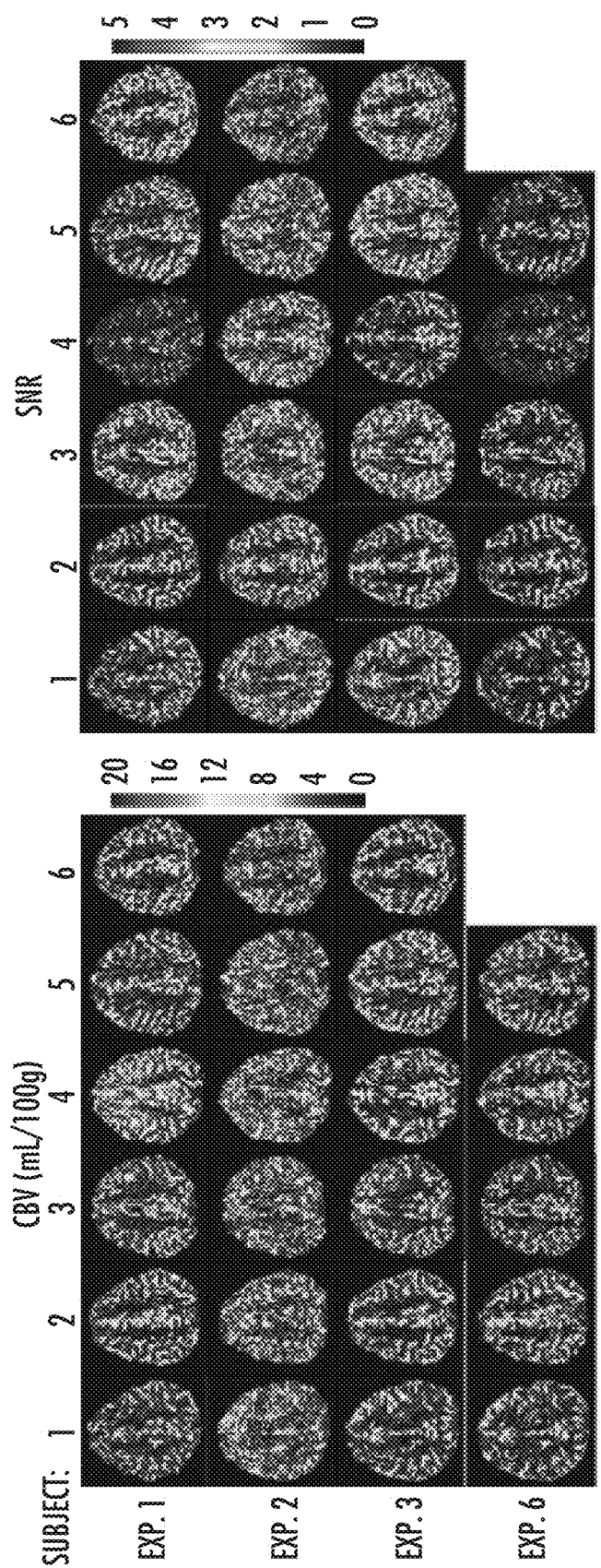
FIGS. 5A and 5B illustrate image views of examples of estimated CBV maps and SNR images, respectively, for 6 subjects (only the 5$^{th}$ slice is shown) from experiments 1-3.

The CBV maps and SNR images from Exp. (1)-(3) of the 5th slice of all 6 subjects are arrayed in FIGS. 5A and 5B. FIGS. 5A and 5B illustrate image views of examples of estimated CBV maps and SNR images, respectively, for 6 subjects (only the $5^{th}$ slice is shown) from experiments 1-3. Similar characteristics of contrast shown in FIGS. 4D-4F are consistent for all participants in both CBV maps (FIG. 5A) and SNR images (FIG. 5B). In one subject (#4), signal fluctuation was found larger than normal in Exp. (1) and reflected in the reduced SNR (FIG. 5B), which might be due to the higher physiology noise such as cardiac pulsation or respiration.

Averaged CBV and SNR values within GM masks and WM ROIs and their GM/WM ratios are reported in Table 2 for Exp. (1)-(3) and (6). For Vc=3.5 mm/s and with CSF-nulling, the averaged local CBV values from Exp. (1) with velocity-compensated control were 5.1±0.6 and 2.4±0.2 mL/100 g for GM and WM, respectively, which were 23% and 32% lower than those from Exp. 2 with velocity-insensitive control. The averaged temporal SNR values for GM and WM from Exp. 1 were 29% and 25% lower than the corresponding ones from Exp. 2, and 14% lower compared to Exp. 3 without CSF-nulling, about. The averaged temporal SNR values from Exp. 6 (Vc=5.0 mm/s) were 25% and 33% lower than those from Exp. 1 (Vc=3.5 mm/s) for GM and WM, respectively, indicating reduced signal available for higher Vc.

TABLE 2

Averaged CBV and Temporal SNR Values (Mean ± SD, n = 6) in GM and WM ROIs and Their GM/WM Ratios of Different Experiments Using Vc = 3.5 mm/s (Exps. 1-3) and Vc = 5.0 mm/s (Exp. 6)

| | CBV (mL/100 g) | | | SNR | | |
|---|---|---|---|---|---|---|
| | GM | WM | ratio | GM | WM | ratio |
| Exp. 1, Vc = 3.5 mm/s, velocity-compensated control, with CSF-nulling | 5.1 ± 0.6 | 2.4 ± 0.2 | 2.1 | 1.2 ± 0.3 | 0.6 ± 0.1 | 2.0 |
| Exp. 2, Vc = 3.5 mm/s, velocity-insensitive control, with CSF-nulling | 5.5 ± 0.4 | 3.5 ± 0.4 | 1.9 | 1.7 ± 0.3 | 0.8 ± 0.1 | 2.1 |
| Exp. 3, Vc = 3.5 mm/s, velocity-compensated control, without CSF-nulling | 5.2 ± 0.4 | 2.4 ± 0.2 | 2.2 | 1.4 ± 0.3 | 0.7 ± 0.1 | 2.0 |
| Exp. 6, Vc = 5.0 mm/s, velocity-compensated control, with CSF-nulling | 5.9 ± 0.7 | 2.2 ± 0.3 | 2.7 | 0.9 ± 0.2 | 0.4 ± 0.1 | 2.3 |

FIGS. 4A-4I illustrate image views of representative data of all 10 slices acquired from subject #2. FIG. 4A illustrates the $SI_{PD}$ images. FIG. 4B illustrates the gray matter-only images. FIG. 4C illustrates the CSF-only images, and quantified CBV maps from various experiments using different sequences. Qualitatively, results of Exps. 1-3 all showed CBV contrast similar to typical gradient echo-EPI based DSC-MRI images, where large vessels appeared in red with hyperintensity and regional CBV values exhibited relatively uniform distribution in cortical areas as well as deep brain regions. When comparing Exp. 1 using velocity-compensated control and Exp. 2 using velocity-insensitive control, large vessels were much less conspicuous and overall regional CBV values were noticeably lower in Exp. 1 than in Exp. 2. FIG. 4D illustrates Exp. (1), velocity-compensated control with CSF-nulling. FIG. 4E illustrates Exp. (2), velocity-insensitive control with CSF-nulling. FIG. 4F illustrates Exp. (3), velocity-compensated control without CSF-nulling. FIG. 4I illustrates Exp. (4), which repeats Exp. (3) with an extra 300 ms T2prep module before the VS pulse train. Results from Exp. (5) and (6) were gathered by Absolute CBV maps were obtained from pulse sequences with interleaved control and label modules for separating vascular signal. A proton density weighted image ($SI_{PD}$) was used for normalization, similar to ASL for CBF mapping. Several technical issues of this subtraction-based method for CBV quantification remain to be considered.

The obtained CBV contrast is qualitatively similar to typical DSC-MRI results. After being corrected using the simulated labeling efficiencies for the different microvascular compartments, the mean CBV values in GM and WM using velocity-compensated controls (5.1 mL/100 g and 2.4 mL/100 g) are comparable to those reported in literature with different imaging modalities. However, the labeling efficiencies of the applied VS pulse train (Vc=3.5 mm/s) are still relatively low for the microvessel compartments, especially in and close to the capillaries (Table 1), where blood moves as slow as 1.0 mm/s. Capillary blood is known to occupy approximately 33% of total CBV and most of it was not labeled here. With the current technique demonstrated for CBV estimation, the signal from arteriolar and venular compartments being detected is therefore only around 1% of the signal in the tissue (using the simulated labeling efficiency for Vc=3.5 mm/s and ignoring T1/T2 relaxations): within CBV, 0.55×21%+0.31×46%=25.8%; within tissue, 25.8%×5.0%=1.3%). This is similar to the ASL effect size for CBF mapping, thus providing similar spatial and temporal resolution, for both clinical and fMRI applications. Indeed, the mean temporal SNR values (1.2 in GM and 0.6 in WM) are close to the recently recorded values for velocity- and acceleration-selective ASL methods. Ideally, if a Vc slower than capillary blood can be used, labeling efficiency will be much higher and uniform across different microvessel compartments, as indicated in Table 1. This would also reduce the need for the assumed compartmental model. Utilizing a smaller Vc value on clinical scanners is limited by the gradient performance (maximal strength, slew rate and eddy current), which can potentially be improved by more advanced gradient system design.

In addition to the various velocities in each compartment, another assumption of the adopted microvasculature model for calculating the labeling efficiency is that of isotropic orientations for the large number of vessels. Since the numbers of different vessels are for the whole brain (about 700,000 $mm^3$, assuming these vessels occupying 5% of the parenchyma), scaling down for the voxel size used in this study (50 $mm^3$) leads to [2, 14, 107, 364, 2793, 54992, 2793, 364, 107, 14, 2] vessels in [a5, a4, a3, a2, a1, cp, v1, v2, v3, v4, v5] per voxel, respectively. Given that there are a large number of vessels in most compartments (except a5, a4, v4, and v5), isotropic orientation seems to be a reasonable assumption for the majority of microvessels.

Figure 7:
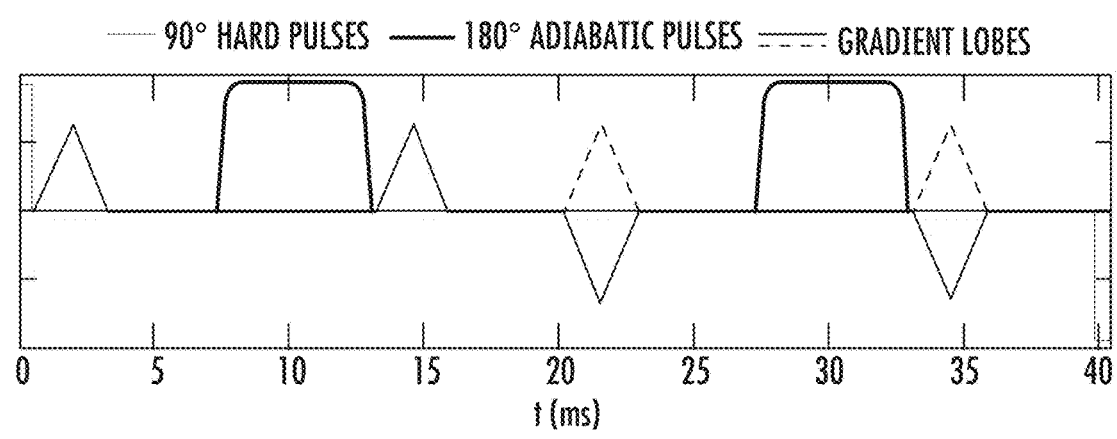
FIG. 7 illustrates a schematic diagram of an ideal VS pulse train with exactly-matched b-values between the velocity-sensitized labeling (solid lines) and velocity-compensated control (dashed lines for the polarity-switched gradient lobes).

Although the pair of velocity-selective labeling and velocity-compensated control modules appear with balanced gradient lobes (FIG. 1A), its diffusion weighting was only matched partially as calculation using the original integration equation for arbitrary gradient waveforms yielded b-values of 6.6 $s/mm^2$ and 2.9 $s/mm^2$, respectively. To exactly match the b-values between the two counterparts, the second and third gradient lobe in the VS labeling module would need to be switched to have no overlap between the paired gradients (FIG. 7). Although this could be an ideal configuration for the VS pulse trains, much higher subtraction errors caused by gradient imperfections were found in phantom studies for this configuration (data not shown) and thus it was not further investigated in this study. The difference between CBV values from the methods using velocity-compensated and velocity-insensitive controls (5.1 mL/100 g vs. 6.6 mL/100 g) could partly be explained by the unbalanced diffusion weighting of the latter. When using velocity-insensitive controls, the control/label subtraction would have an extra term from static tissue: $SI_{PD} \cdot (1-CBV/\lambda/100) \cdot M(T_{1,t}) \cdot M(T_{2,t}) \cdot (1-M(ADC_t))$. Assuming CBV=5.1 mL/100 g, $T_{1,t}$=1.20 s, $T_{2,t}$=80 ms, $ADC_t$=0.8×10$^{-3}$ $mm^2$/s, applying Eq. [1-7] and a b-value of 6.6 $s/mm^2$ (Vc=3.5 mm/s) would yield an overestimated CBV of 7.2 mL/100 g, which is slightly larger than the averaged result of 6.6 mL/100 g. When the control is velocity-compensated as used in this study (b=2.9 $s/mm^2$), the bias of overestimation is reduced from 42% to 23%.

Another difference between the two control methods was the amount of signal from large vessels being detected. It was later realized that the velocity-compensated pulse train for the control was actually acceleration-sensitive with a cutoff acceleration (Ac) of 0.57 $m/s^2$. Acceleration-selective ASL with similar Ac values has recently been demonstrated for CBF measurement. Thus pulsatile flow in large vessels would also cause blood suppression in the velocity-compensated control and lead to signal reduction in the final CBV images, whereas the velocity-insensitive control remains insensitive to acceleration and maintains the large vessel signal.

The calculated CBV values (Eq. [7]) depend on the $T_1$ and $T_2$ values of each microvessel compartment, which are functions of Hct and Y and can be estimated for each subject. Note that the Hct values in microvascular segments are known to be approximately 75%-88% of that for large vessels (Fahraeus effect). If Hct=0.42×0.80=0.34 were used in the calculations, $T_{1,a}$, $T_{1,v}$ (1.84 s, 1.70 s) should be increased by about 5% and $T_{2,a}$, $T_{2,v}$ (138 ms, 53 ms) by about 10%. Raising the selected $T_{1,a}$, $T_{1,v}$ and $T_{2,a}$, $T_{2,v}$ for [+5%, +10%] would change CBV with [2.7%, 5.5%] and [−2.3%, −4.4%], respectively, assuming the other one unchanged.

Pulsatile CSF flow was found to generate signal in the CBV maps not only within ventricles but also in subarachnoid space (FIG. 4G). This is not surprising since the velocity of CSF in these areas ranges from 2 mm/s to 43 mm/s. Given that the CSF volume fraction typically varies from 10 to 20% in different brain cortical regions, a CSF suppression module is necessary to remove the nuisance and have reliable CBV measurement.

Figures 6A, 6B:
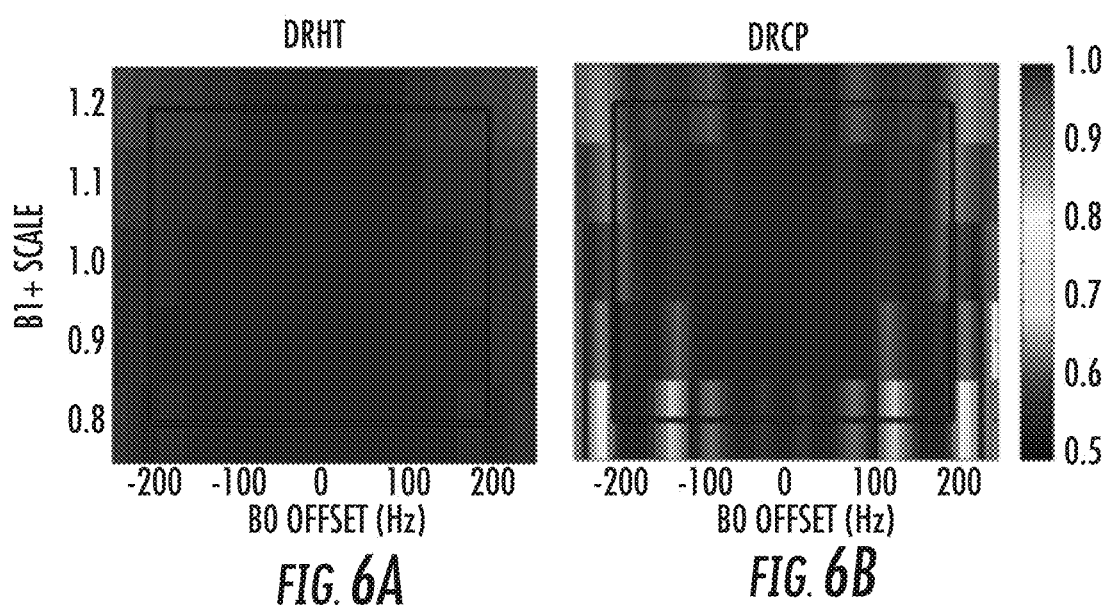
FIG. 6A illustrates an image with DRHT pulses and FIG. 6B illustrates an image with DRCP pulses.

To demonstrate the efficacy of the adiabatic refocusing pulses described herein, numerical simulations using the Bloch equations based on matrix rotation were conducted using Matlab (MathWorks, Inc., Natick, Mass., USA). The sensitivity to a typical range of B0/B1 offset incurred in the brain at 3T (B0 field: ±200 Hz; B1+scale (ratio of actual flip angle to nominal input flip angle): from 0.8 to 1.2) was evaluated for a $T_2$prep module (the VS labeling module without gradients) with refocusing pulses employing: 1) double refocused hyperbolic tangent (DRHT) pulses and 2) double refocused composite (DRCP) pulses. The maximum amplitude of the nominal RF pulse is assumed to be 13.5 uT (575 Hz), as the body coil of the scanner specifies. Since T1/T2 effects are not considered, longitudinal magnetization Mz lower than 1.0 are resulted from errors in refocusing. For each pulse train, $M_z$ responses to different $B_0$ off-resonance frequencies and $B_1$+scales are simulated. Compared to DRCP pulses, DRHT pulses are shown to yield sufficient refocusing in various B0/B1 conditions. FIG. 6A illustrates an image with DRHT pulses and FIG. 6B illustrates an image with DRCP pulses.

FIG. 7 illustrates a schematic diagram of an ideal VS pulse train with exactly-matched b-values between the velocity-sensitized labeling (solid lines) and velocity-compensated control (dashed lines for the polarity-switched gradient lobes). This configuration is not further tested herein due to the much higher subtraction error found on phantom studies, which is caused by gradient imperfection such as eddy currents.

The present invention provides, as described above, a novel non-contrast-enhanced method for quantifying absolute CBV values using velocity-selective spin labeling approach was developed at 3T. The technical feasibility was demonstrated and the quantified CBV values of gray matter and white matter of healthy subjects were consistent with literature reports. Further optimization of this reported technique is needed to boost the CBV signal, especially from the vessels with very slow flow, e.g. capillary. Furthermore, this technique is not limited to brain perfusion mapping and can be readily extended to measure blood volume in other parts of the body.

It should be noted that the pulse sequences, imaging protocols, described herein can be executed with a program(s) fixed on one or more non-transitory computer readable medium. The non-transitory computer readable medium can be loaded onto a computing device, server, imaging device processor, smartphone, tablet, phablet, or any other suitable device known to or conceivable by one of skill in the art.

It should also be noted that herein the steps of the method described can be carried out using a computer, non-transitory computer readable medium, or alternately a computing device, microprocessor, or other computer type device independent of or incorporated with an imaging or signal collection device. An independent computing device can be networked together with the imaging device either with wires or wirelessly. The computing device for executing the present invention can be a completely unique computer designed especially for the implementation of this method. Indeed, any suitable method of analysis known to or conceivable by one of skill in the art could be used. It should also be noted that while specific equations are detailed herein, variations on these equations can also be derived, and this application includes any such equation known to or conceivable by one of skill in the art.

A non-transitory computer readable medium is understood to mean any article of manufacture that can be read by a computer. Such non-transitory computer readable media includes, but is not limited to, magnetic media, such as a floppy disk, flexible disk, hard disk, reel-to-reel tape, cartridge tape, cassette tape or cards, optical media such as CD-ROM, writable compact disc, magneto-optical media in disc, tape or card form, and paper media, such as punched cards and paper tape.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A method for determining blood volume for a subject comprising:
   performing velocity-sensitized labeling modules with a magnetic resonance imaging scanner;
   embedding refocusing pulses between velocity-sensitive labeling modules;
   performing alternating velocity-encoding gradients, wherein the alternating velocity-encoding gradients are configured to suppress the signal of blood flowing above a cutoff velocity;
   performing a pair of acquisitions with the magnetic resonance imaging scanner; and
   determining blood volume from the subtraction of the pair of acquisitions, then scaled with the relaxation factors of blood T1 and T2.

2. The method of claim 1 further comprising using refocusing pulses comprising adiabatic pulses or composite pulses.

3. The method of claim 1 further comprising using a velocity-sensitized labeling module comprising ±90° pulses.

4. The method of claim 1 further comprising using alternating velocity-encoding gradients.

5. The method of claim 1 further comprising leaving a gap between each gradient and RF pulse to minimize the effect of eddy currents.

6. The method of claim 1 further comprising generating a non-contrast-enhanced MRI map of blood volume.

7. The method of claim 1 further comprising using velocity-selective (VS) pulse trains in paired control and label modules for separating vascular signal by subtraction.

8. The method of claim 1 further comprising leveraging a subtraction-based method using a pair of acquisitions immediately following velocity-sensitized pulse trains for a label module and its corresponding control module, respectively.

9. The method of claim 1 further comprising cancelling out a signal of static tissue and a resulting difference signal comes from the flowing blood compartment above a cutoff velocity.

10. The method of claim 1 further comprising normalizing to a proton density-weighted image acquired separately and scaled with the blood T1 and T2 relaxation factors and obtaining a quantitative measurement of blood volume.

11. A system for determining blood volume for a subject comprising:
    a magnetic resonance imager; and
    a non-transitory computer readable medium programmed for:
    performing velocity-sensitized labeling modules with a magnetic resonance imaging scanner;
    embedding refocusing pulses between velocity-sensitive labeling modules;
    performing alternating velocity-encoding gradients, wherein the alternating velocity-encoding gradients are configured to suppress the signal of blood flowing above a cutoff velocity;
    performing a pair of acquisitions with the magnetic resonance imaging scanner; and
    determining blood volume from the subtraction of the pair of acquisitions, then scaled with the relaxation factors of blood T1 and T2.

12. The system of claim 11 further comprising using refocusing pulses comprising adiabatic pulses or composite pulses.

13. The system of claim 11 further comprising using a velocity-sensitized labeling module comprising ±90° pulses.

14. The system of claim 11 further comprising using alternating velocity-encoding gradients.

15. The system of claim 11 further comprising leaving a gap between each gradient and RF pulse to minimize the effect of eddy currents.

16. The system of claim 11 further comprising generating a non-contrast-enhanced MRI map of blood volume.

17. The system of claim 11 further comprising using velocity-selective (VS) pulse trains in paired control and label modules for separating vascular signal by subtraction.

18. The system of claim 11 further comprising leveraging a subtraction-based method using a pair of acquisitions immediately following velocity-sensitized pulse trains for a label module and its corresponding control module, respectively.

19. The system of claim 11 further comprising cancelling out a signal of static tissue and a resulting difference signal comes from the flowing blood compartment above a cutoff velocity.

20. The system of claim 11 further comprising normalizing to a proton density-weighted image acquired separately and scaled with the blood T1 and T2 relaxation factors and obtaining a quantitative measurement of blood volume.

* * * * *